United States Patent
Yang et al.

(10) Patent No.: US 7,029,959 B1
(45) Date of Patent: Apr. 18, 2006

(54) SOURCE AND DRAIN PROTECTION AND STRINGER-FREE GATE FORMATION IN SEMICONDUCTOR DEVICES

(75) Inventors: Chih-Yuh Yang, San Jose, CA (US); Shibly S. Ahmed, San Jose, CA (US); Srikanteswara Dakshina-Murhty, Austin, TX (US); Cyrus E. Tabery, Sunnyvale, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/429,737

(22) Filed: May 6, 2003

(51) Int. Cl.
*H01L 21/84* (2006.01)
*H01L 21/00* (2006.01)

(52) U.S. Cl. .................... 438/164; 438/585; 438/586; 438/157; 438/671

(58) Field of Classification Search ................ 438/585, 438/586, 618, 622, 623, 624, 636, 669, 670, 438/671, 720, 725, 151, 157, 164; 257/365, 257/347, 353, 329, 343
See application file for complete search history.

(56) References Cited

U.S. PATENT DOCUMENTS

| | | | | |
|---|---|---|---|---|
| 5,965,461 A * | 10/1999 | Yang et al. | ................ | 438/717 |
| 6,252,284 B1 * | 6/2001 | Muller et al. | ............... | 257/412 |
| 6,362,111 B1 * | 3/2002 | Laaksonen et al. | ......... | 438/725 |
| 6,379,872 B1 * | 4/2002 | Hineman et al. | .......... | 430/316 |
| 6,413,802 B1 * | 7/2002 | Hu et al. | .................... | 438/151 |
| 6,448,165 B1 * | 9/2002 | Yu et al. | ..................... | 438/585 |
| 6,458,662 B1 * | 10/2002 | Yu | ............................. | 438/286 |
| 6,458,680 B1 * | 10/2002 | Chung et al. | ............... | 438/597 |
| 6,537,906 B1 * | 3/2003 | Mori | ......................... | 438/636 |
| 6,583,469 B1 * | 6/2003 | Fried et al. | ................. | 257/329 |
| 6,611,029 B1 * | 8/2003 | Ahmed et al. | ............. | 257/365 |
| 6,630,407 B1 * | 10/2003 | Keil et al. | .................. | 438/717 |
| 6,686,231 B1 * | 2/2004 | Ahmed et al. | ............. | 438/164 |
| 6,794,230 B1 * | 9/2004 | Huang et al. | .............. | 438/154 |
| 6,815,268 B1 * | 11/2004 | Yu et al. | ..................... | 438/149 |

OTHER PUBLICATIONS

Digh Hisamoto et al.: "FinFET—A Self-Aligned Double-Gate MOSFET Scalable to 20 nm," IEEE Transactions on Electron Devices, vol. 47, No. 12, Dec. 2000, pp. 2320-2325.

Yang-Kyu Choi et al.: "Sub-20nm CMOS Fin FET Technologies," 0-7803-5410-9/99 IEEE, Mar. 2001, 4 pages.

Xuejue Huang et al.: "Sub-50 nm P-Channel Fin FET," IEEE Transactions on Electron Devices, vol. 48, No. 5, May 2001, pp. 880-886.

Yang-Kyu Choi et al.: "Nanoscale CMOS Spacer FinFET for the Terabit Era," IEEE Electron Device Letters, vol. 23, No. 1, Jan. 2002, pp. 25-27.

(Continued)

*Primary Examiner*—Maria F. Guerrero
(74) *Attorney, Agent, or Firm*—Harrity Snyder, LLP

(57) ABSTRACT

A method of manufacturing a semiconductor device may include forming a fin structure on an insulator and depositing a gate material over the fin structure. The method may also include depositing an organic anti-reflective coating on the gate material and forming a gate mask on the organic anti-reflective coating. The organic anti-reflective coating around the gate mask may be removed, and the gate material around the gate mask may be removed to define a gate.

17 Claims, 11 Drawing Sheets

OTHER PUBLICATIONS

Xuejue Huang et al.: "Sub 50-nm FinFET: PMOS," 0-7803-7050-3/01 IEEE, Sep. 1999 4 pages.

Co-pending U.S. Appl. No. 10/301,732, filed Nov. 22, 2002, entitled "Method for Forming a Gate in a FINFET Device," 17 page specification, 12 pages of drawings.

* cited by examiner

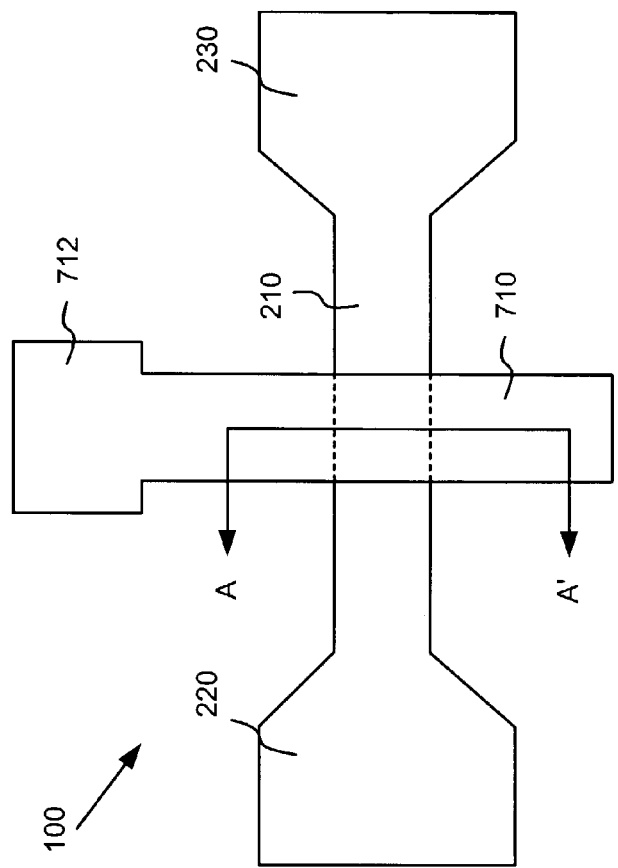
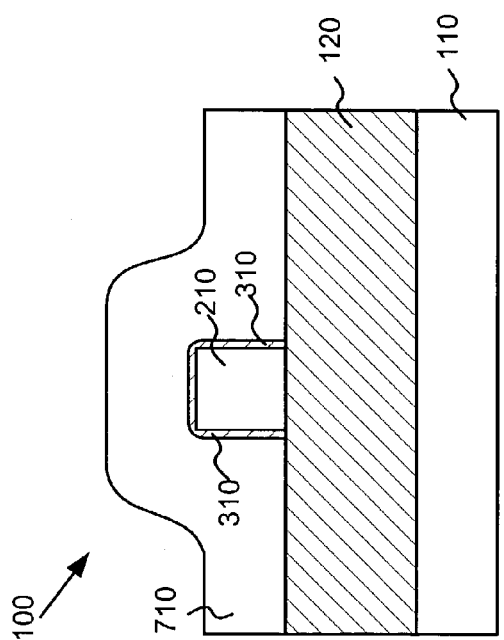
FIG. 7B
FIG. 7A

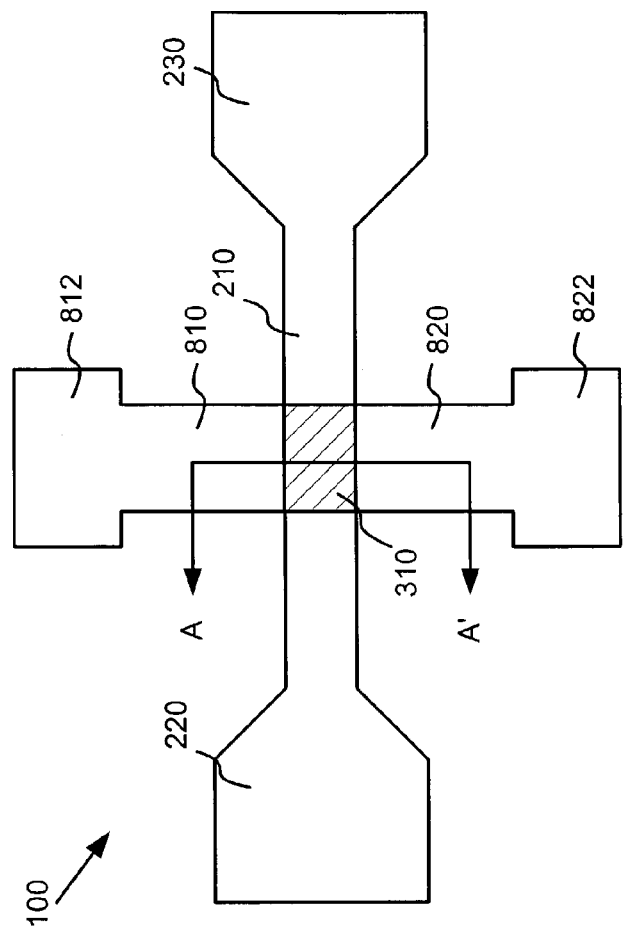
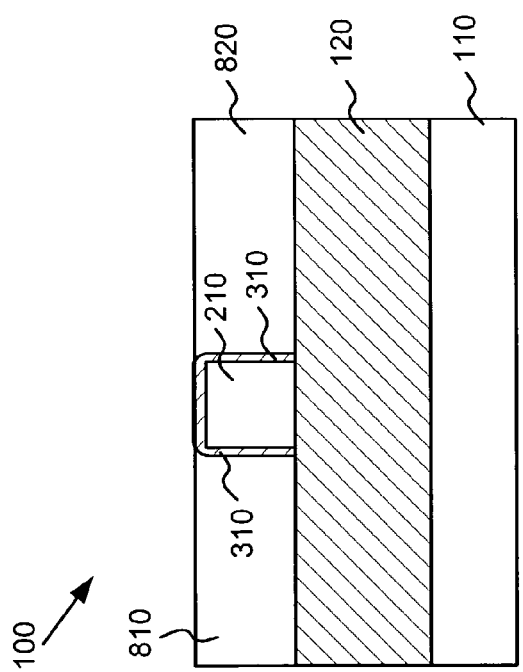
FIG. 8B
FIG. 8A

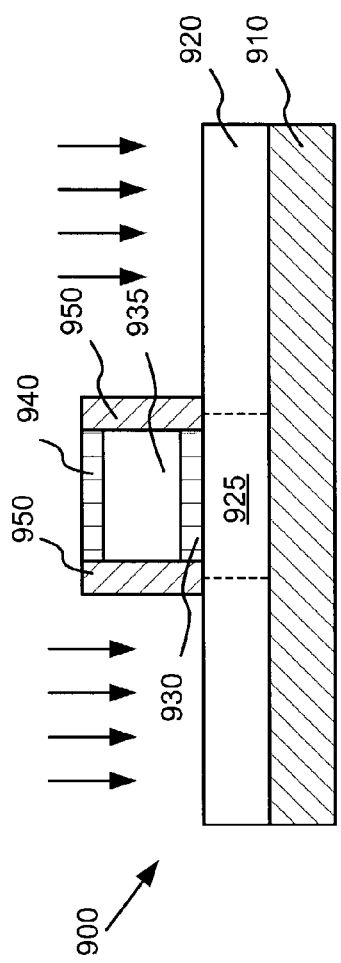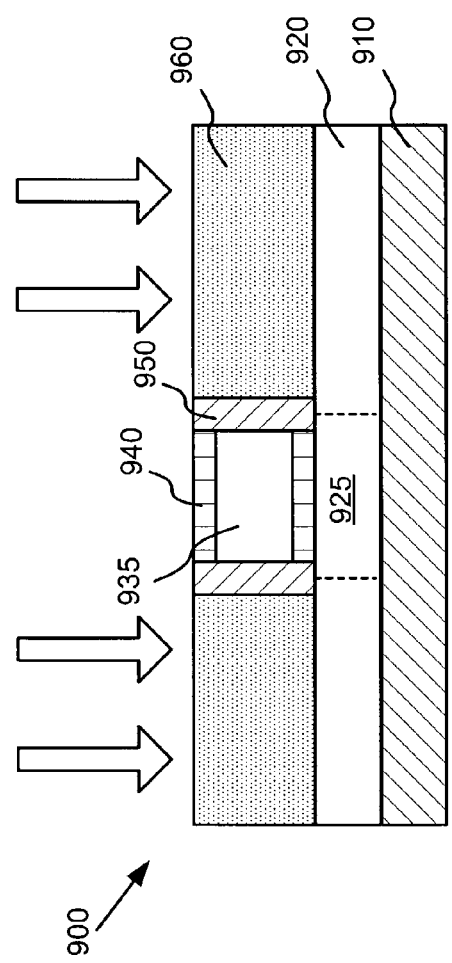

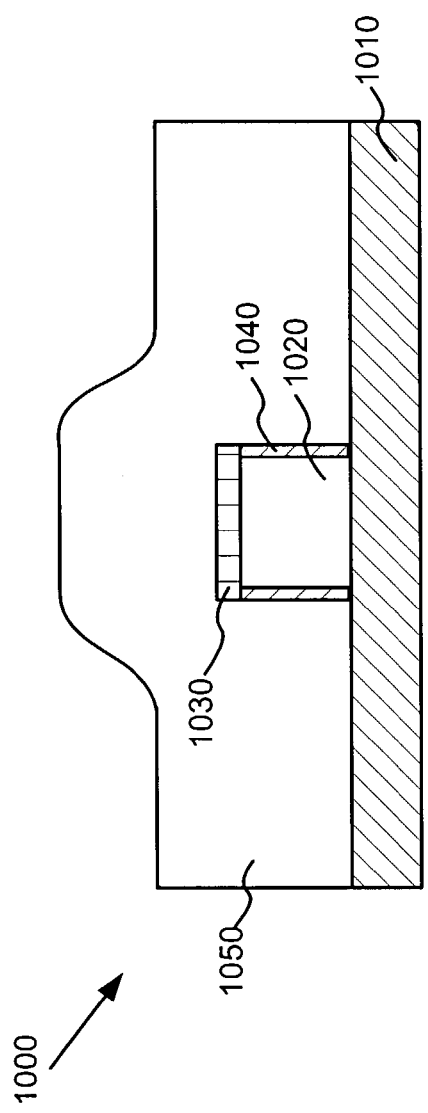
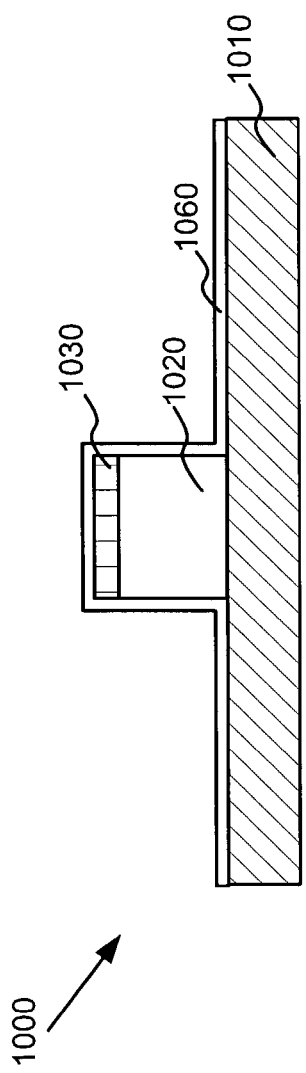

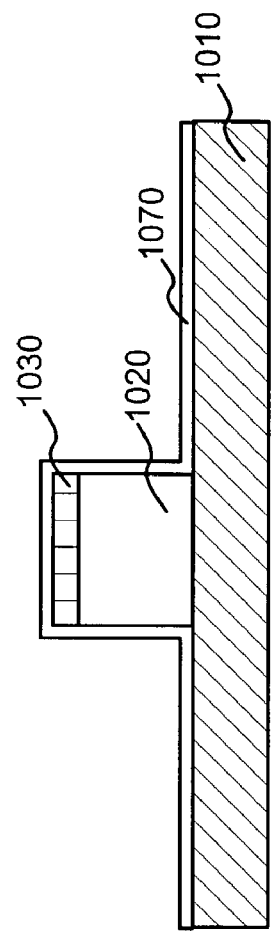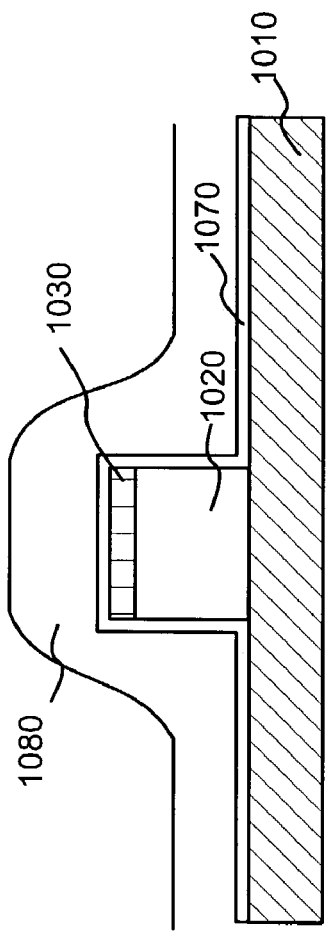
FIG. 10C
FIG. 10D

US 7,029,959 B1

SOURCE AND DRAIN PROTECTION AND STRINGER-FREE GATE FORMATION IN SEMICONDUCTOR DEVICES

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a methodology for forming a gate in a FinFET device. The gate may be formed without damaging other regions of the FinFET device, such as source/drain regions.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a method of manufacturing a semiconductor device including forming a fin structure on an insulator and depositing a gate material over the fin structure. The method may also include depositing an organic anti-reflective coating on the gate material and forming a gate mask on the organic anti-reflective coating. The organic anti-reflective coating around the gate mask may be removed, and the gate material around the gate mask may be removed to define a gate.

According to another aspect of the invention, a method of manufacturing a semiconductor device may include forming a fin structure on an insulator and depositing polysilicon over the fin structure. The method may also include depositing an anti-reflective coating on the polysilicon and forming a gate mask on the anti-reflective coating. The anti-reflective coating may be etched from around the gate mask using a non-fluorine etchant. The polysilicon may be etched from around the gate mask to form a gate.

According to a further aspect of the invention, a method of manufacturing a semiconductor device may include forming a vertically-oriented fin structure on an insulator and depositing polysilicon over the fin structure. The method may also include depositing an organic anti-reflective coating on the polysilicon and forming a gate mask on the organic anti-reflective coating. The method may further include etching the organic anti-reflective coating from around the gate mask using $HBr/O_2$ chemistry or $He/N_2/O_2$ chemistry and etching the polysilicon from around the gate mask to define a gate. The gate mask may be removed to form the gate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIG. 7A is a cross-section illustrating the formation of a gate in accordance with an exemplary embodiment of the present invention.

FIG. 7B is a top view of the semiconductor device of FIG. 7A in accordance with an exemplary embodiment of the present invention.

FIG. 8A is a cross-section illustrating the formation of two gates in accordance with another exemplary embodiment of the present invention.

FIG. 8B is a top view of the semiconductor device of FIG. 8A.

FIGS. 9A and 9B are cross-sectional views illustrating the thermal annealing of source/drain regions in a FinFET in accordance with another implementation of the present invention.

FIGS. 10A–10D are cross-sectional views illustrating local oxidation for a gate dielectric in a FinFET in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a methodology for forming a gate in a FinFET device. The gate may be formed without damaging other regions of the FinFET device, such as source/drain regions.

Figure 1:
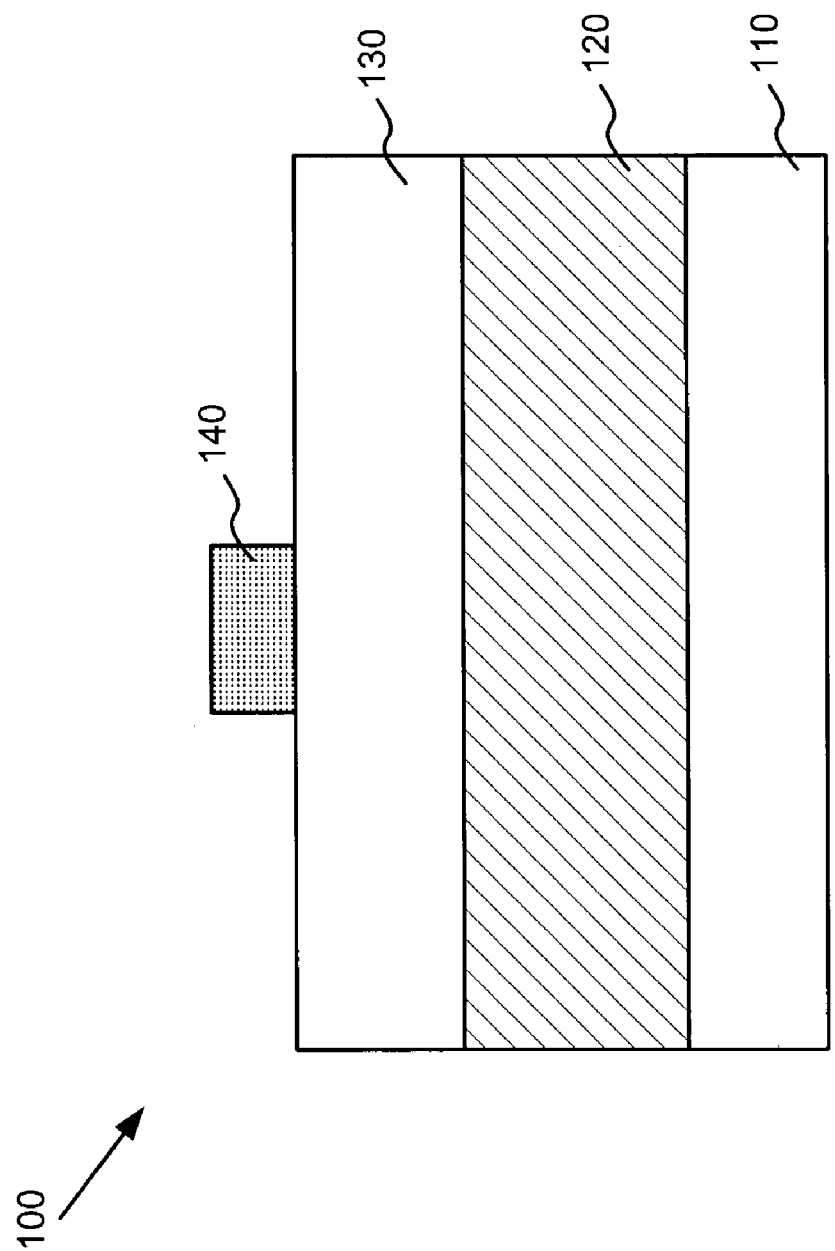
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 1500 Å to about 3000 Å. Silicon layer 130 may include monocrystalline or polycrystalline silicon having a thickness ranging from about 100 Å to about 1500 Å. Silicon layer 130 is used to form a fin for a FinFET transistor device, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

A photoresist material may be deposited and patterned to form a photoresist mask 140 for subsequent processing. The photoresist may be deposited and patterned in any conventional manner.

Figure 2A:
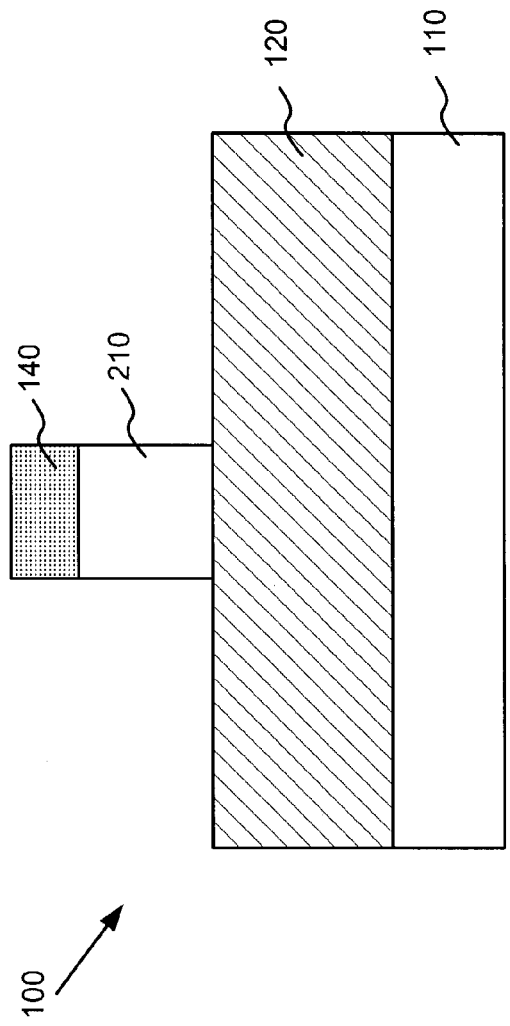
FIG. 2A is a cross-section illustrating the formation of a fin in accordance with an exemplary embodiment of the present invention.

Semiconductor device 100 may then be etched using the photoresist mask 140. In an exemplary implementation, silicon layer 130 may be etched in a conventional manner, with the etching terminating on buried oxide layer 120, as illustrated in FIG. 2A. Referring to FIG. 2A, silicon layer 130 has been etched to form fin 210.

Figure 2B:
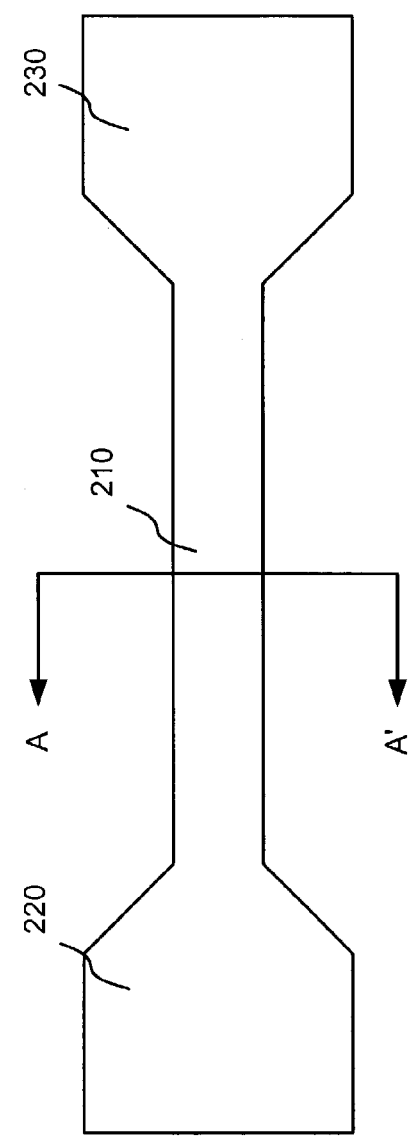
FIG. 2B schematically illustrates the top view of the semiconductor device of FIG. 2A in accordance with an exemplary embodiment of the present invention.

After the formation of fin 210, source and drain regions may be formed adjacent the respective ends of fin 210. For example, in an exemplary embodiment, a layer of silicon, germanium or combination of silicon and germanium may be deposited, patterned and etched in a conventional manner to form source and drain regions. FIG. 2B illustrates a top view of semiconductor device 100 including source region 220 and drain region 230, formed adjacent fin 210 on buried oxide layer 120, according to an exemplary embodiment of the present invention. The top view in FIG. 2B is oriented such that the cross-section in FIG. 2A is taken along line A–A' in FIG. 2B.

Figure 3:
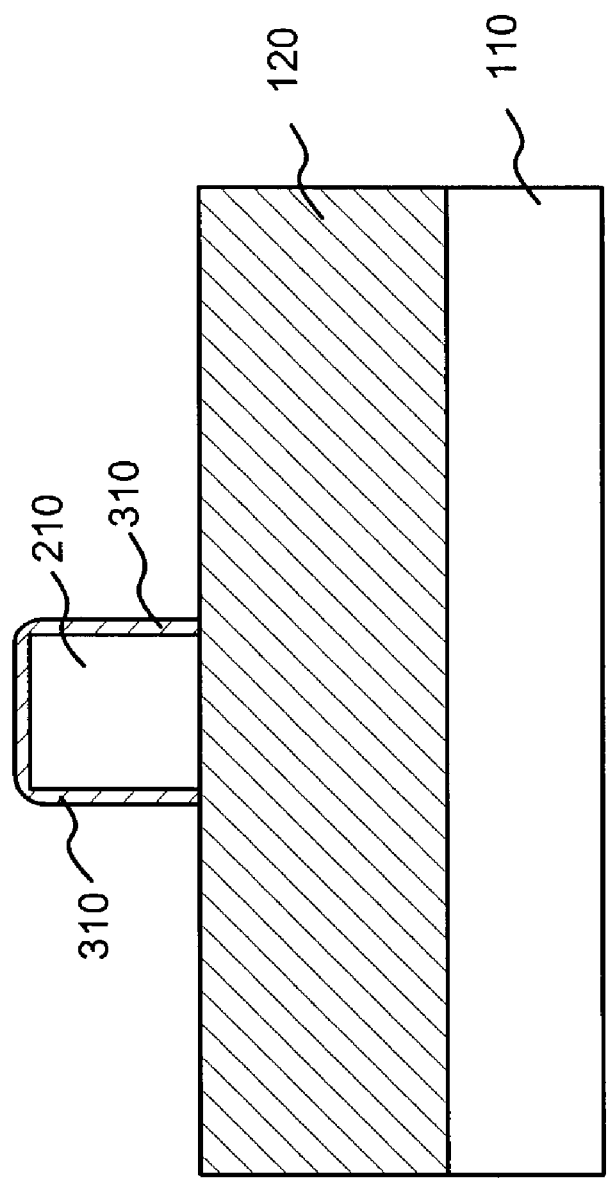
FIG. 3 is a cross-section illustrating the formation of a gate dielectric layer on the fin of FIG. 2A in accordance with an exemplary embodiment of the present invention.

The photoresist mask 140 may be removed and a dielectric layer may then be formed on fin 210. For example, a thin oxide film 310 (e.g., $SiO_2$) may be thermally grown or deposited on fin 210, as illustrated in FIG. 3. The cross-sectional view of FIG. 3 is taken along line A–A' in FIG. 2B. The oxide film 310 may be grown to a thickness of about 10 Å to about 30 Å and may be formed on the exposed silicon side surfaces and top surface of fin 210 to act as a gate dielectric layer.

Figure 4:
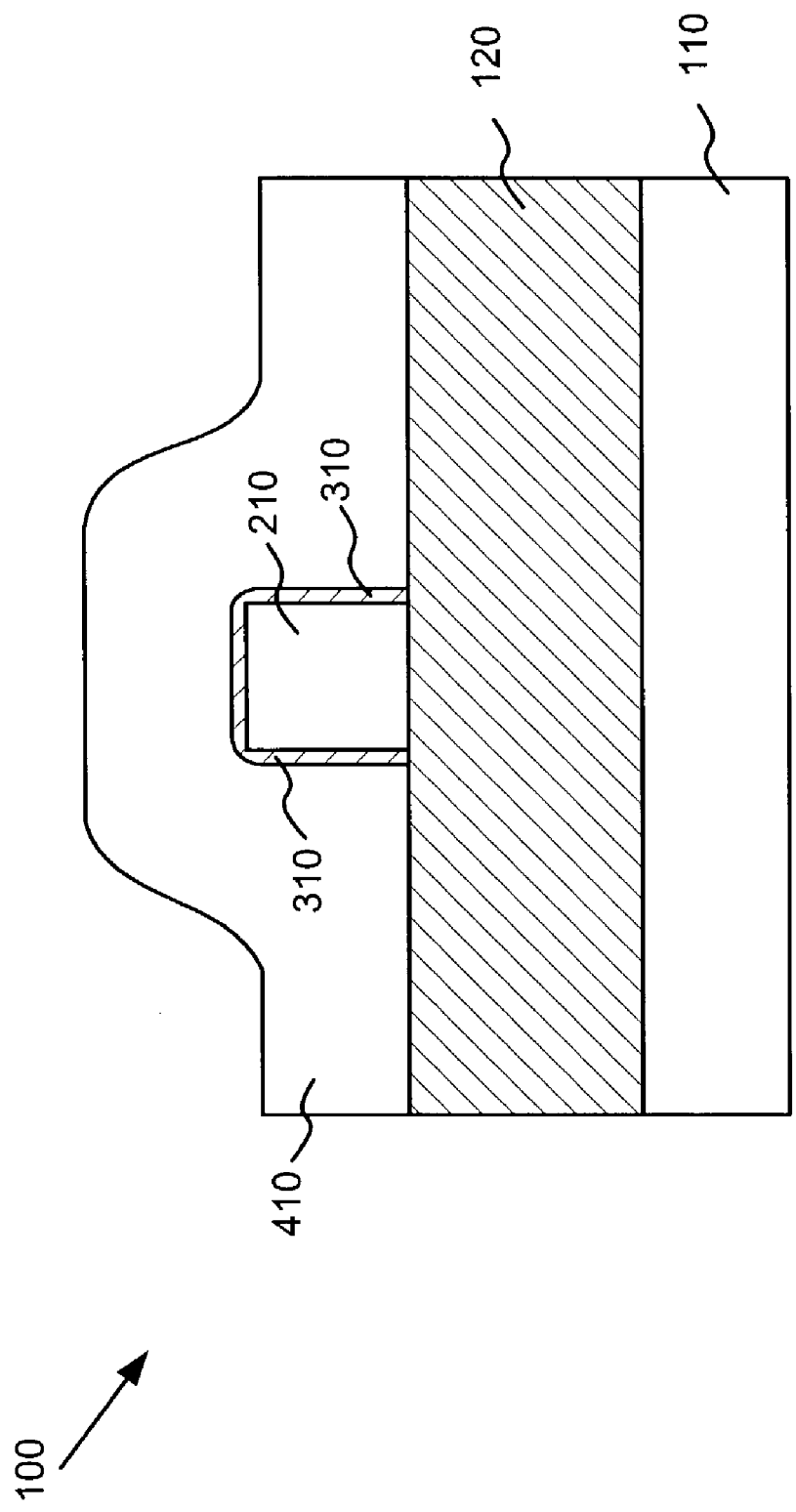
FIG. 4 is a cross-section illustrating the formation of a gate material on the device of FIG. 3 in accordance with an exemplary embodiment of the present invention.

A gate material layer 410 may then be deposited over semiconductor device 100 in a conventional manner, as illustrated in FIG. 4. The gate material layer 410 may be used for the subsequently formed gate(s). In an exemplary implementation, the gate material layer 410 may include polysilicon deposited using conventional chemical vapor deposition (CVD) to a thickness ranging from about 200 Å to about 1000 Å. Alternatively, other semiconducting materials, such as germanium or combinations of silicon and germanium, or various metals may be used as the gate material.

Figure 5:
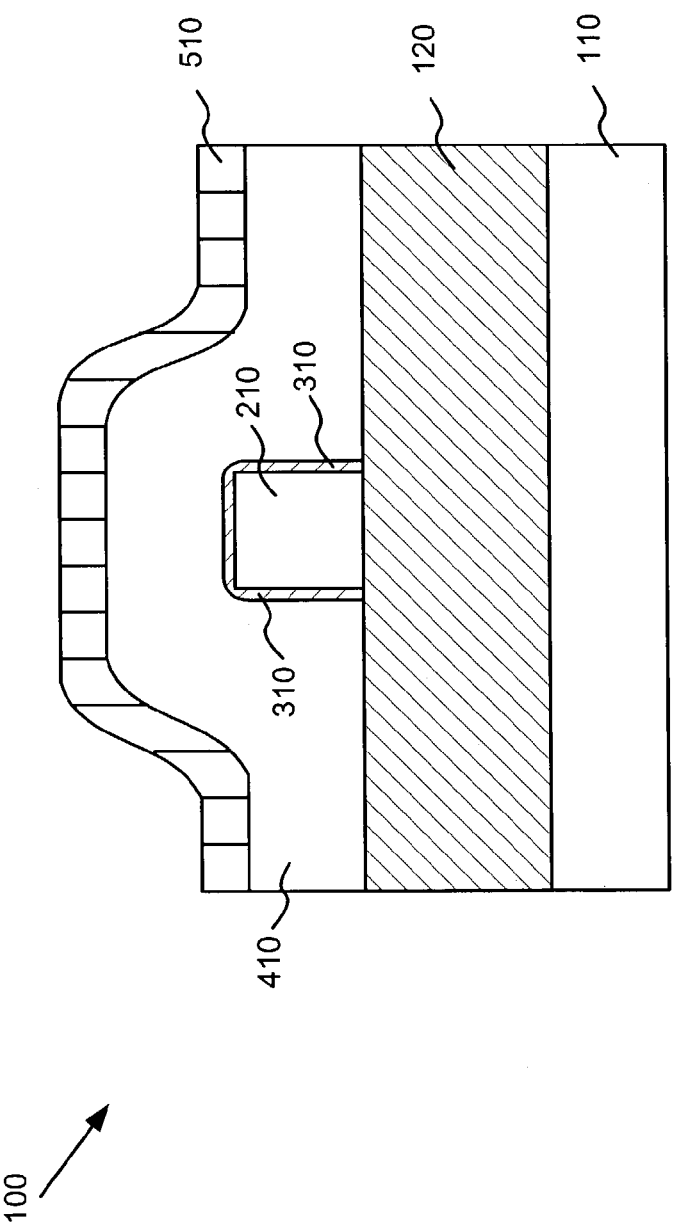
FIG. 5 is a cross-section illustrating the formation of an anti-reflective coating layer on the device of FIG. 4 in accordance with an exemplary embodiment of the present invention.

A bottom anti-reflective coating (BARC) layer 510 may be deposited over gate material layer 410, as illustrated in FIG. 5. The BARC layer 510 may be deposited using, for example, a spin-on process and may function to reduce reflection of light during subsequent lithography used to form the gate. In an exemplary implementation, the BARC layer 510 may include an organic anti-reflective coating (ARC), such as Shipley® AR3 (248 nm organic ARC) or Shipley® AR24 (248 nm organic ARC). In some implementations, BARC layer 510 may be used in conjunction with a top anti-reflective coating (TAR) (not shown); in other implementations, BARC layer 510 may be the only anti-reflective layer used in making the semiconductor device 100. BARC layer 510 may be deposited to a thickness ranging from about 100 Å to about 800 Å.

Figure 6:
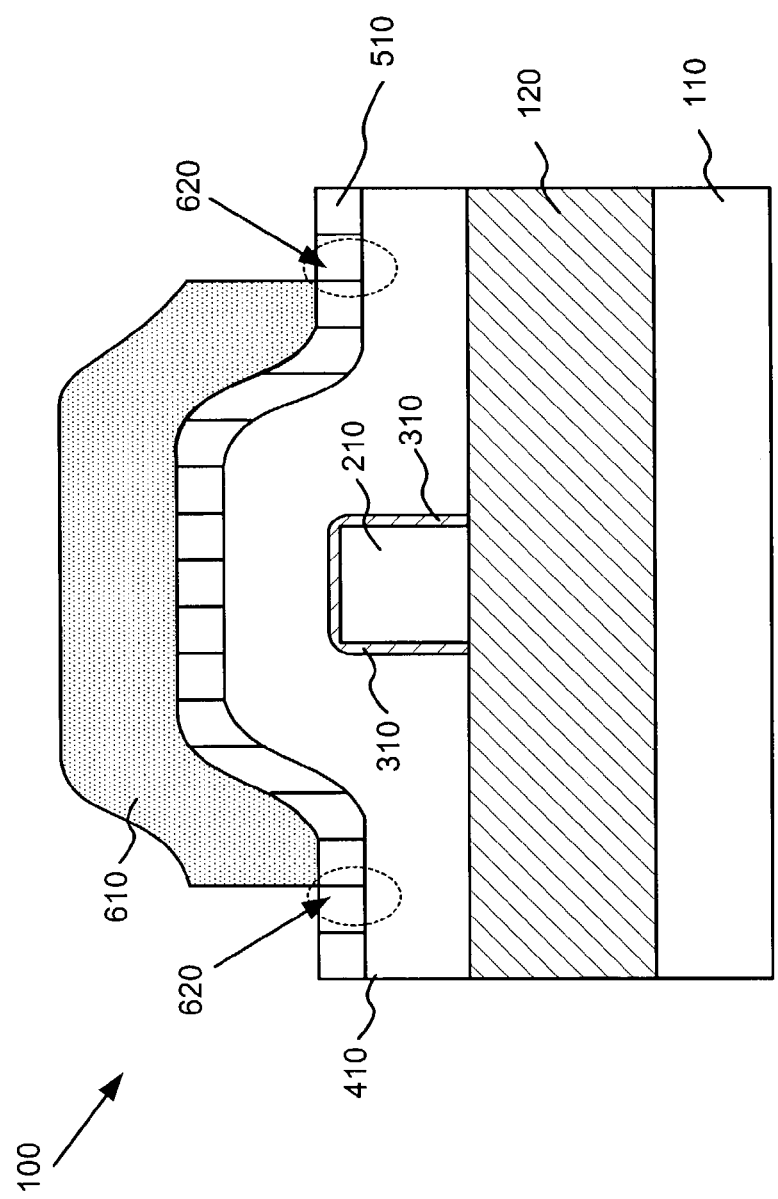
FIG. 6 is a cross-section illustrating the formation of a gate mask on the device of FIG. 5 in accordance with an exemplary embodiment of the present invention.

Next, a photoresist material either 248 nm or 193 nm may be deposited over BARC layer 510. The photoresist material may then be patterned in a conventional manner to form gate mask 610, as illustrated in FIG. 6. The particular configuration of the gate mask 610 may be based on the particular circuit requirements associated with the gate for the semiconductor device 100. For example, the photoresist material may be patterned and trimmed to form a gate mask 610 designed to achieve very small critical dimensions (e.g., from about 15 nm to about 50 nm) associated with the subsequently formed gate.

The BARC layer 510 may then be etched. The etch chemistry, particular flow rates, power ranges, bias voltages, etch duration and other parameters associated with etching BARC layer 610 may be optimized based on the thickness of BARC layer 510. In one implementation consistent with the principles of the invention, the organic ARC material in BARC layer 510 may be etched with $HBr/O_2$ chemistry or $He/N_2/O_2$ chemistry (e.g., in a plasma form).

In an exemplary implementation, BARC layer 510 may also be overetched (e.g., with the same non-fluorine etch chemistry: $HBr/O_2$ or $He/N_2/O_2$) to ensure that unwanted residual portions of BARC layer 510, referred to as source of "stringers," do not remain after the etching. The stringers often remain around fin regions 210, 220, and 230 (that is not covered by gate after gate etch) in FIG. 2B. To ensure that no stringers remain, the etching of BARC layer 510 may continue a predetermined period of time (i.e., be overetched) after the top surface of gate material layer 410 has been exposed. It should be understood that the particular duration of the overetching is based on the particular device parameters, such as the thicknesses of BARC layer 510. In each case, the overetching ensures that no stringers remain in regions 620 after the BARC layer 510 has been etched.

After the BARC layer 510 has been completely etched, gate material layer 410 may be etched to form the gate for semiconductor device 100. The etch chemistry, particular flow rates, power ranges, bias voltages, etch duration and other parameters associated with etching gate material layer 410 may be optimized based on the thickness of gate material layer 410 and the particular device requirements. For example, HBr/Cl$_2$/He—O$_2$ chemistry may be used to etch away the polysilicon of gate material layer 410. Gate material layer 410 may be overetched using HBr/He—O$_2$ chemistry to remove any superfluous gate material (e.g., polysilicon stringers).

After gate material layer 410 has been etched, gate mask 610 and the portion of BARC layer 510 located below gate mask 610 may be removed, resulting in semiconductor device 100 illustrated in FIG. 7A. Referring to FIG. 7A, the silicon layer 410 has been patterned and etched to form gate 710 for semiconductor device 100.

FIG. 7B illustrates a top view of semiconductor device 100 consistent with the present invention after the gate etching has been performed. As illustrated, semiconductor device 100 includes gate 710 disposed over either side of fin 210. Gate 710 may include gate electrode or contact 712 formed at one end, as illustrated in FIG. 7B. A metal, such as tungsten, cobalt, nickel, titanium, or tantalum, may be deposited over the gate 710 followed by a thermal annealing to form a metal-silicide compound on the top surface of gate 710.

In some implementations consistent with the present invention, the semiconductor device 100 illustrated in FIG. 7A may be planarized, via for example, a chemical-mechanical polishing (CMP), to remove the portion of gate structure 710 above fin 210. In this implementation, the gate material in the vertical direction is approximately even with the gate oxide 310 located over the top surface of fin 210 as shown in FIG. 8A. In this case, gates 810 and 820 may be physically and electrically separated by fin 210 and may be separately biased during operation of semiconductor device 100.

FIG. 8B illustrates a top view of semiconductor device 100 consistent with such an implementation. As illustrated, semiconductor device 100 includes a double gate structure with gates 810 and 820 disposed on either side of fin 210 with gate dielectric 310 formed over the fin 210. Gates 810 and 820 may include gate electrodes or contacts 812 and 822 formed at the respective ends of gates 810 and 820, as illustrated in FIG. 8B. A metal, such as tungsten, cobalt, nickel, titanium, or tantalum, may be deposited over the gates 810 and 820 followed by a thermal annealing to form a metal-silicide compound on the top surfaces of gates 810 and 820.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 220 and 230.

Typically, silicon rich nitride (SiRN) or silicon oxynitride (SiON) material is used in BARC layer 510, and fluorine chemistry (e.g., CF$_4$) is used to etch and overetch the SiRN or SiON. Overetching with such fluorine chemistry to remove stringers, however, may damage oxide film 310, and possibly the fin 210 itself. Accordingly, using an organic ARC for the BARC layer 510 and the corresponding non-fluorine, organic ARC etch chemistry (e.g., HBr/O$_2$ or He/N$_2$/O$_2$) as disclosed above may prevent damage to fin 210 and oxide film 310 during overetching.

Thus, in accordance with the present invention, a double-gate FinFET device is formed in an efficient manner. Advantageously, the gate(s) 710 or 810/820 of the FinFET device may be formed without damaging other areas of the FinFET device through the use of organic ARC material and non-fluorine etch chemistry. In addition, gate(s) 710 or 810/820 may also be formed without residual stringers that may have an adverse effect on device performance. The resulting structure exhibits good short channel behavior. The present invention can also be easily integrated into conventional semiconductor fabrication processing.

OTHER IMPLEMENTATIONS

In some implementations, it may be desirable to thermally anneal a source/drain region in a FinFET. FIGS. 9A and 9B are cross-sectional views illustrating the thermal annealing of source/drain regions in a FinFET in accordance with another implementation of the present invention. A device 900 may include an insulator 910, a silicon layer 920, a gate dielectric 930, a gate 935, a gate oxide cap 940, and oxide spacers 950. Silicon layer 920 may have been formed into a fin region 925 under gate 935 and source/drain regions on either side of fin region.

As shown in FIG. 9A, source/drain regions of silicon layer 920 may be implanted with, for example, n-type or p-type impurities. The particular implantation dosages and energies may be selected based on the particular end device requirements. Gate oxide cap 940 may protect the gate 935 during such implantation, and spacers 950 may ensure that fin 925 is not implanted.

Next, an oxide layer 960 may be deposited over the source/drain regions and polished back as illustrated in FIG. 9B. Laser radiation may illuminate and heat up oxide layer 960 to thermally anneal the underlying source/drain regions of silicon layer 920. In this manner, the source/drain of FinFET 900 may be thermally annealed using a laser.

In other implementations, forming a gate dielectric by local oxidation in a FinFET may be desired. FIGS. 10A–10D are cross-sectional views illustrating local oxidation for a gate dielectric in a FinFET 1000 in accordance with another implementation of the present invention. Referring to FIG. 10A, FinFET 1000 includes a buried oxide (BOX) layer 1010 formed on a substrate (not shown), silicon fin 1020, dielectric cap 1030, gate oxide 1040 and dummy gate material layer 1050. Dielectric cap 1030 may include silicon nitride (SiN) and dummy gate material layer 1050 may include polysilicon. These layers/structures may be formed in a conventional manner.

Gate oxide 1040 and dummy gate material layer 1050 may be removed, and a thin layer of tantalum (Ta) 1060 may be deposited, as shown in FIG. 10B. Tantalum layer 1060 may range from about 5 Å to about 20 Å in thickness. Referring to FIG. 10C, tantalum layer 1060 may be oxidized to form gate dielectric layer 1070. Gate dielectric layer 1070 may be composed of Ta$_2$O$_5$. Another tantalum layer 1080 may be deposited on gate dielectric layer 1070 as illustrated in FIG. 10D. Tantalum layer 1080 may be subsequently patterned to form the gate of the FinFET device 1000. In this manner, the gate dielectric 1070 of FinFET 1000 may be formed by local oxidation.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A method of manufacturing a semiconductor device, comprising:
    forming a fin structure on an insulator;
    depositing a gate material over the fin structure;
    depositing an organic anti-reflective coating on the gate material to a thickness ranging from about 300 Å to about 800 Å;
    forming a gate mask on the organic anti-reflective coating;
    removing the organic anti-reflective coating around the gate mask, wherein the removing the organic anti-reflective coating includes etching the organic anti-reflective coating until a top surface of the gate material is exposed and continuing the etching for a predetermined period of time after the top surface of the gate material has been exposed; and
    removing the gate material around the gate mask to define a gate.

2. The method of claim 1, wherein the forming a fin structure includes:
    etching a silicon layer on the insulator to form a silicon fin, and
    forming at least one dielectric layer on a top and sides of the silicon fin.

3. The method of claim 1, wherein the depositing a gate material includes:
    depositing polysilicon over the fin structure.

4. The method of claim 1, wherein the organic anti-reflective coating (ARC) includes 248 nm organic ARC.

5. The method of claim 1, further comprising:
    removing the gate mask over the gate.

6. The method of claim 1, wherein the removing the gate material around the gate mask to define a gate includes:
    overetching the gate material to ensure that all of the gate material not located under the gate mask is removed.

7. The method of claim 1, wherein the removing the organic anti-reflective coating includes:
    etching the organic anti-reflective coating around the gate mask with a non-fluorine etch chemistry.

8. The method of claim 7, wherein the non-fluorine etch chemistry includes $HBr/O_2$ chemistry or $He/N_2/O_2$ chemistry.

9. A method of manufacturing a semiconductor device, comprising:
    forming a fin structure on an insulator;
    depositing polysilicon over the fin structure;
    depositing an anti-reflective coating on the polysilicon to a thickness ranging from about 350 Å to about 800 Å;
    forming a gate mask on the anti-reflective coating;
    etching the anti-reflective coating from around the gate mask using a non-fluorine etchant until a top surface of the polysilicon has been exposed;
    continuing the etching for a predetermined period of time after the top surface of the polysilicon has been exposed; and
    etching the polysilicon from around the gate mask to form a gate.

10. The method of claim 9, wherein the forming a fin structure includes:
    etching a silicon layer on the insulator to form a vertical silicon fin, and
    forming at least one dielectric layer on a top and sides of the vertical silicon fin.

11. The method of claim 9, wherein the anti-reflective coating (ARC) includes 248 nm organic ARC.

12. The method of claim 9, wherein the anti-reflective coating does not include silicon rich nitride (SiRN) or silicon oxynitride (SiON).

13. The method of claim 9, wherein the non-fluorine etchant includes $HBr/O_2$ or $He/N_2/O_2$.

14. The method of claim 9, further comprising:
    overetching the polysilicon to ensure that all of the polysilicon not located under the gate mask is removed.

15. A method of manufacturing a semiconductor device, comprising:
    forming a vertically-oriented fin structure on an insulator;
    depositing polysilicon over the fin structure;
    depositing an organic anti-reflective coating to a thickness ranging from about 350 Å to about 800 Å on the polysilicon;
    forming a gate mask on the organic anti-reflective coating;
    etching the organic anti-reflective coating from around the gate mask using $HBr/O_2$ chemistry or $He/N_2/O_2$ chemistry, the etching including etching the organic anti-reflective coating until a top surface of the polysilicon has been exposed and continuing the etching for a predetermined period of time after the top surface of the polysilicon has been exposed;
    etching the polysilicon from around the gate mask to define a gate; and
    removing the gate mask to form the gate.

16. The method of claim 15, wherein the organic anti-reflective coating (ARC) includes 248 nm organic ARC.

17. The method of claim 15, further comprising:
    overetching the polysilicon to ensure that all of the polysilicon not located under the gate mask is removed.

* * * * *